United States Patent [19]
Marion et al.

[11] Patent Number: 5,968,389
[45] Date of Patent: Oct. 19, 1999

[54] METHOD AND MACHINE FOR HYBRIDIZATION BY REFUSION

[75] Inventors: Francois Marion, Saint Egreve; Jean-Marc DeBono, Grennoble; Jean-Louis Pornin, Crolles; Bernard Tucek, Monestier de Clermont, all of France

[73] Assignee: Commissariat a l'Energie Atomique, France

[21] Appl. No.: 08/811,046

[22] Filed: Mar. 4, 1997

[30]     Foreign Application Priority Data

Mar. 15, 1996 [FR] France ................................. 96 03301

[51] Int. Cl.⁶ ............................. H01L 21/58; H05K 3/34
[52] U.S. Cl. ................... 219/404; 219/388; 228/180.22; 228/262.9
[58] Field of Search ............................. 219/85.16–85.18, 219/85.22, 388, 404; 29/742, 762, 842, 843; 228/180.21, 180.22, 262.9; 165/61, 80.2

[56]                  References Cited

U.S. PATENT DOCUMENTS

| | | | |
|---|---|---|---|
| 3,724,068 | 4/1973 | Galli | 228/180.21 |
| 4,711,114 | 12/1987 | Rohde et al. | 72/234 |
| 4,887,760 | 12/1989 | Yoshino et al. | 228/180.22 |
| 4,908,696 | 3/1990 | Ishihara et al. | |
| 4,954,453 | 9/1990 | Venutolo | |
| 5,090,609 | 2/1992 | Nakao et al. | 228/180.22 |
| 5,131,584 | 7/1992 | Boitel et al. | 228/180.22 |
| 5,186,378 | 2/1993 | Alfaro | 228/180.21 |

FOREIGN PATENT DOCUMENTS

| | | |
|---|---|---|
| 0668612 | 2/1995 | European Pat. Off. . |
| 57-020441 | 2/1982 | Japan . |
| 60-126843 | 7/1985 | Japan . |
| 7-086336 | 3/1995 | Japan . |

*Primary Examiner*—Joseph Pelham
*Attorney, Agent, or Firm*—Burns, Doane, Swecker & Mathis LLP

[57]                    ABSTRACT

A method and device for hybridization of components by solder beads on a substrate using an oven, comprising: raising the temperature of a heating element of the oven, with no contact either with substrate or with component, bringing substrate into thermal contact with heating element for time $\Delta t$, and uncoupling substrate and heating element at the end of time $\Delta t$.

58 Claims, 4 Drawing Sheets

METHOD AND MACHINE FOR HYBRIDIZATION BY REFUSION

TECHNICAL FIELD AND PRIOR ART

This invention relates to the "flip-chip" hybridization technique.

There are two main types of technique to obtain hybridization of a component, a chip for example, on a substrate, using solder beads:

the first is a so-called "fusion" technique: the beads of a fusible material (for example a tin-lead alloy or indium) are heated to their melting temperature or higher while remaining in contact with "wettable" pads formed on the chip to be connected, the second technique is a so-called "pressure" technique: the beads of a fusible material (tin-lead alloy or indium) are pressed onto the surface to be connected, and the bonding is made by thermocompression below the melting temperature of the materials to be connected.

The present invention relates to the first type of technique, that is to say the fusion technique.

Two parameters are of primary importance for implementing said technique. They are:

fusion time: hybridization is characterized in its cycle of temperatures above a $T_{min}$ temperature for a given time, temperature uniformity: at least one chip, or at least one component, is hybridized on at least one substrate, and temperature uniformity of the substrate over the entire cycle of temperatures must remain between certain limits, the limits typically allowed being ±2% around an average temperature of the substrate or substrates.

The cycles of temperatures must be of limited length. If the cycle is too long it will lead to;

excessive diffusion of the solder materials in the materials to be soldered, that is to say in the wettable surfaces, hardening of the non volatile residues of the soldering flux used, making them impossible to clean, destruction of the hybridized components unable to withstand long, high temperature cycles.

It is therefore important to reduce to minimum value the time during which the temperature is above $T_{min}$ temperature.

More precisely, the temperature rise time $t_m$ to reach the maximum temperature of cycle $T_{max}$ may be expressed as:

$$t_m = \frac{C}{\eta w}(T_{max} - T_{min})$$

in which w is the electric energy applied to the heating device (in general an infrared source), and in which η is a constant expressing the yield of the energy transfer between the energy applied at the heating source and the calorific energy collected by the heating element, C is the calorific capacity of the unit made up of the heating element, substrate and the chips to be hybridized.

If a short temperature rise time is required, it is therefore necessary to have available a low calorific capacity C, high energy w and a high constant η.

Also, the temperature lowering time is proportional to the energy trapped in the heated element, and inversely proportional to the cooling power of the cooling means of the element (for example force injected air).

If $T_{m(t)}$ and $T_{M(t)}$ respectively designate the minimum spatial temperature and the maximum spatial temperature of the heating element, the temperature uniformity can at all times be measured by:

$$U = \frac{T_{M(t)} - T_{m(t)}}{T_{M(t)} + T_{m(t)}}$$

The heating source is generally an infrared source made up of lamp ramps each emitting limited non-uniform radiation. Heating element uniformity can only be restored through distribution of the absorbed energy by thermal conduction in the plane of the heating element. Lateral conduction in the heating element is however proportional to the thickness of the heating element. As uniformity U is inversely proportional to heating element thickness, and to lateral conduction, good uniformity therefore requires great heating element thickness and high calorific capacity C. As explained above, high calorific capacity leads to long temperature rise times and consequently to a long cycle of temperatures.

If, for example, very good uniformity in the region of 2% is required, this is expressed as:

$$U<2\% \rightarrow C>C_0,$$

and if a maximum rise time t0 is laid down, then:

$$tm < t_0 \Rightarrow W > \frac{CO(T_{max} - T_{min})}{\eta t_0}$$

Consequently, to achieve both good uniformity and a minimum rise time, it is necessary to increase heating power. In turn, high heating power leads to increased thermal loss, all lost power contributing towards heating the rest of the machine which is an aligned precision machine. Cooling means must therefore be provided to evacuate not only the energy stored in the heating element but also the residual energy distributed throughout the rest of the machine, which involves a substantial complication of the latter and a considerable increase in its production cost. Also, heating element cooling methods by convection are insufficient, and it must be cooled by a liquid which leads to yet another increase in the cost of the machine.

Finally, when considerable heating power is involved, the temperature of the heating element continues to increase by inertia once the device or the heating lamps have been switched off, which means that peak temperatures are not easily reproducible (the typical reproducibility observed is ≧2%).

According to an example of embodiment of a method of the prior art, multi-hybridization of chips is carried out on a silicon substrate with a diameter of 150 mm and a thickness of 600 mm, hybridization having to be made:

with a cycle whose time $t_m$ is less than 40 seconds, $T_{min}$ in and $T_{max}$ being respectively 150° C. and 320° C., a temperature uniformity of 5% during the cycle.

These specifications require a heating element size which leads to an electric power of 4500 watts for lamp control.

DISCLOSURE OF THE INVENTION

The objective of the invention is to improve the fusion technique in such manner as to reduce the time needed for soldering, and therefore the length of the temperature cycle to which the component and substrate to be hybridized are subjected, and in such manner as to improve the uniformity of soldering temperature on the hybridized components, and more particularly in so-called multihybridization. Finally, production costs and complexity of hybridization machines need to be reduced while maintaining or improving the technical specifications for soldering temperature cycles.

More precisely, the object of the invention is a method of hybridization of chip components by solder beads, on a substrate using an oven, comprising:

raising the temperature of a heating element of the oven, with no contact either with the substrate or with the component to be hybridized, bringing the substrate into thermal contact with the heating element for a time Δt, uncoupling the substrate and heating element at the end of time Δt.

This method prevents the substrate being joined to the heating element of the oven during the temperature rise. Contact time is well defined and it is possible to carry out hybridization with a short contact time, typically less than 10 seconds. This method is therefore of particular interest for components that are very sensitive to temperature differences.

Also, before the substrate is placed in thermal contact with the heating element, good uniformity of said element can be attained.

The contact between the substrate and the heating element may be made at a time when the temperature of said element ceases to increase, and therefore improved peak reproducibility is obtained.

Finally, the cooling system for the heating element of the oven is no longer critical.

The heating means to be used for the heating element do not need to be as powerful as those used by devices of the prior art since the method of the invention makes it possible to overcome the restraints relating firstly to the length of the cycle of temperatures and secondly to temperature uniformity.

Bringing the substrate into thermal contact may be made by lowering said substrate onto the heating element. This type of movement limits the causes of misalignment of the component in relation to the substrate.

Also, the substrate and the component to be hybridized may rest on a mobile heating-plate, the contact made by said mobile heating-plate with the heating element providing thermal contact between the substrate and the heating element.

It is therefore possible to control the temperature rise ramps for the substrate (the calorific capacity of the mobile heating-plate being known).

The use of a mobile heating-plate means that different sized substrates may be deposited on it;

This method may also comprise the following preliminary stages:

positioning the substrate on the heating element, or on a mobile heating-plate resting on the heating element, the latter being maintained at a lower temperature than the melting temperature of the solder beads.

aligning the component to be hybridized on the substrate uncoupling (a) the unit made up of the component to be hybridized, the substrate and possibly the mobile heating-plate, and (b) the heating element, before the rise in temperature of the latter.

In this case, the positioning and alignment of the substrate and component take place on the heating element itself.

Uncoupling the unit made up of the component, the substrate and possibly the mobile heating-plate, may be made by a lifting movement above the heating element.

Again said movement allows the causes of misalignment to be limited.

It is possible to carry out the preliminary alignment stage of the component at a first so-called alignment station, then the preliminary uncoupling stage at a second so-called uncoupling station, the heating element being moved from the first station to the second station between the two preliminary stages of alignment and uncoupling.

Therefore the unit made up of the substrate and component is only, after alignment, subjected to a vertical movement in relation to the heating element, and it is said element which is moved between the two stations. Consequently, the movements of the substrate are of limited extent and avoid the problems of component knocking, vibration or misalignment in relation to the substrate which would occur if the substrate were moved in relation to the heating element.

According to another embodiment, the positioning of the substrate takes place on a support which itself has no contact with the heating element;

then, the component to be hybridized is aligned on the substrate. The method therefore does not require any cooling device for the heating element, since thermal contact between this element and the substrate-component unit only takes place after alignment of the component in relation to the substrate.

A lifting stage of the substrate, of the component to be hybridized and possibly of the mobile heating-plate may also be provided.

This stage may take place after they have been transferred to a lifting and lowering station.

In this second embodiment, the thermal contacting of the substrate with the heating element may take place by moving the heating element towards the lifting and lowering station, then lowering the unit made up of the component and substrate and possibly the mobile heating-plate after the temperature of the heating element has been raised.

Therefore, once again, it is only vertical movements of the substrate and component that are involved either by moving or lifting, which limits problems of misalignment when it is the substrate which is moved in relation to the heating element.

Regardless of the form of embodiment, the movements of lifting and/or lowering may be made using a bell-jar inside which a controlled atmosphere is established.

Also, after fusion of the material making up the hybridization beads, followed by uncoupling of the substrate and heating element, a substrate cooling stage may be carried out, for example by contact of the substrate or mobile heating-plate with a cooling surface.

A further objective of the invention is a device for the hybridization of components on a substrate, comprising:

an oven comprising a heating element, means of bringing a substrate into thermal contact with the heating element, after the heating element has reached a certain melting temperature, means of uncoupling the substrate and heating element, after the substrate has been heated.

With this device it is possible to set in operation the method of the inventor with the advantages connected with the latter.

The means of bringing the substrate into contact with the heating element (and/or the means of uncoupling the substrate and the heating element) may be of a type allowing a vertical movement, for example a bell-jar and means of establishing a controlled atmosphere under said bell-jar.

Also, means may be provided of moving the heating element in a plane, for example a mobile trolley on which this heating element is mounted. It is therefore the heating element which is moved laterally, which limits movements of the substrate in relation to the heating element, and therefore reduces the risks of misalignment during the course of the process.

According to another embodiment, the device may also comprise a support on which a substrate may be positioned having no contact with the heating element.

In all cases, means of cooling the substrate may also be provided, for example means comprising a cooling plate.

SHORT DESCRIPTION OF THE FIGURES

At all events, the characteristics and advantages of the invention shall be more clearly understood with the following description. This description concerns the examples of embodiment given for explanatory purposes which are non-restrictive and refer to the appended drawings in which:

FIG. 1 illustrates a first embodiment of a method according to the invention

FIGS. 2A to 2C represent the preliminary stages of the method according to the invention, FIG. 3 represents a variant for movement of a substrate in relation to a heating element under a method according to the invention, FIG. 4 represents a variant of the invention, FIGS. 5A to 5E represent stages of setting in operation another embodiment, FIGS. 6A to 6D represent stages of setting in operation a further embodiment of the invention.

DETAILED DESCRIPTION OF EMBODIMENTS OF THE INVENTION

Figure 1:
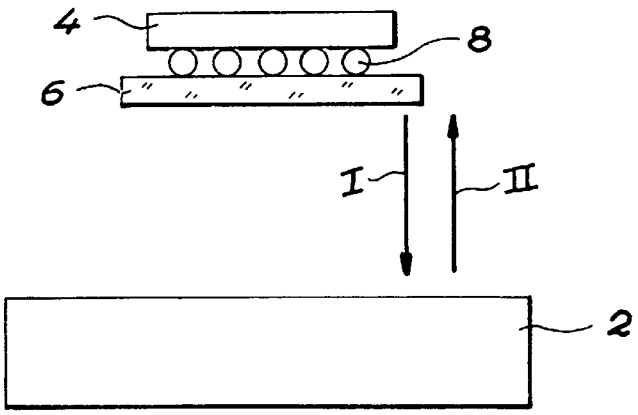

A first embodiment shall be described with reference to FIG. 1. In this figure, reference 2 designates the heating element of an oven whose other parts, in particular the heating means, are not shown. These means may be of heating resistance or heating pipe type, but less powerful than the means used (infrared lamp type) for devices of the prior art. A component 4 is to be hybridized on a substrate 6 using microbeads 8 such as for example tin-lead or indium beads. The minimum fusion temperature to be reached is dependent upon the type of these microbeads 8.

Component 4 and substrate 6 provided with beads are previously aligned one in relation to the other, then placed in contact one with the other.

Before bringing substrate 6 into contact with heating element 2, the latter undergoes a temperature rise until a temperature is reached allowing fusion of beads 8. Temperature and heat uniformity of heating element 2 may be controlled using heat sensors (for example: platinum or thermocouple probes) positioned on the heating element. After the temperature rise of heating element 2, substrate 6 and component 4 are brought into thermal contact with heating element 2; this contacting is symbolised in FIG. 1 by arrow 1. The contact is maintained for a given time Δt. This is for example determined experimentally, as the shortest time required to solder all the bonding beads on the wettable surfaces opposite component 4.

After lapse of time Δt, the unit made up of substrate 6 and component 4 is uncoupled from heating element 2; this uncoupling is symbolised by arrow II in FIG. 1.

Figure 2A:
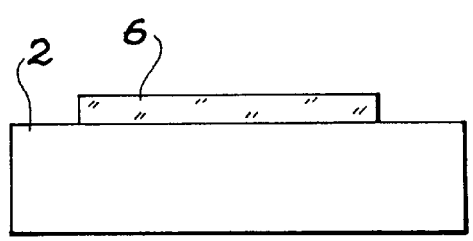
Figure 2B:
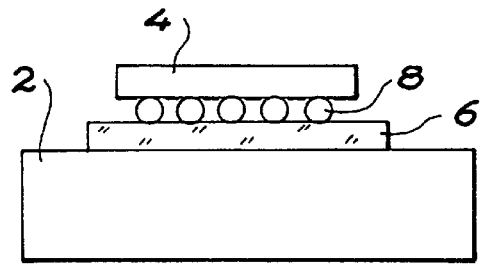
Figure 2C:
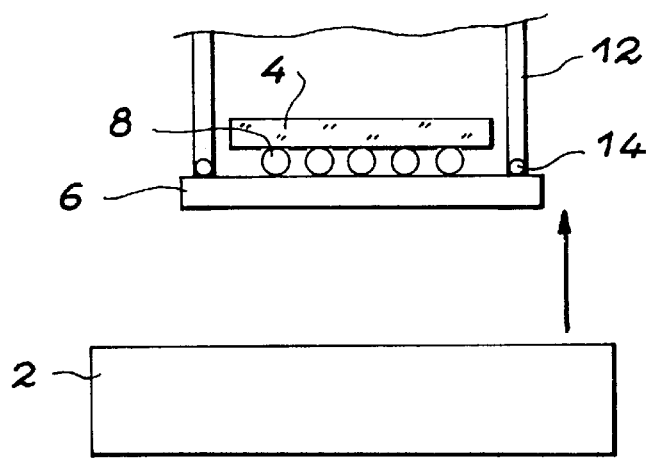

Previously, substrate 6 and component 4 may have been prepared on heating element 2, said heating element being maintained at room temperature or, at least, at a temperature that is lower that the minimum melting temperature of beads 8. Therefore, during a first preliminary stage (FIG. 2A) substrate 6 provided with beads is deposited on heating element 2; component 4 is aligned, heating element 2 being maintained at all times at the previously mentioned temperature (FIG. 2B). Finally, during a third preliminary stage, the unit made up of substrate 6 and component 4 is distanced, or uncoupled from heating element 2 before raising the temperature of the latter (FIG. 2C). The temperature is then raised and the above-described stages with reference to FIG. 1 are carried out.

Figure 3:
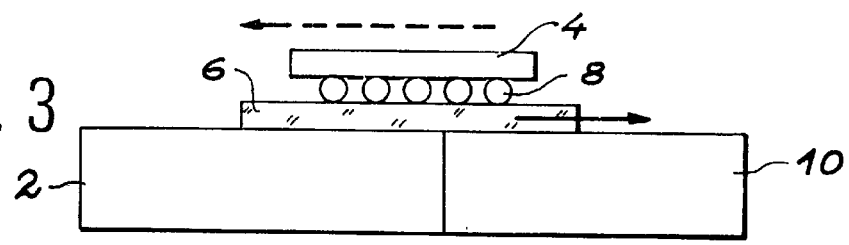

The thermal contacting of the substrate with the heating element and the uncoupling of the substrate and heating element are preferably made by lifting or lowering the substrate-component unit in relation to heating element 2. According to another embodiment, illustrated in FIG. 3, substrate 6 is caused to move laterally in relation to heating element 2. Therefore, after aligning, the substrate is transferred to a support 10, thermally uncoupled from heating element 2. The temperature of the latter is then raised and subsequently the substrate 6 and component 4 unit is moved from support 10 towards heating element 2 (dashed arrow in FIG. 3). This type of movement is possible but it may give rise to increased knocking, vibration or misalignment problems for the component-substrate unit than when movement is made over a vertical axis which only requires a range of movement in the region of a few millimetres at the most. This type of movement following a vertical axis may be made by means of a bell-jar coming into contact with substrate 6 inside which a controlled atmosphere may be established. Reference 12 in FIG. 2C designates the lower part of the wall of a bell-jar with a controlled atmosphere; the means of establishing a controlled atmosphere inside the bell-jar are not shown in this figure. The seal between substrate 6 against the end of wall 12 is maintained by hollowed areas provided at several points around periphery 14 of the substrate. When substrate 6 is in contact position with heating element 2, which has been preheated above the melting point of the solder material, the controlled atmosphere is maintained inside the bell-jar in such manner as to permit soldering of the beads of substrate 6 to the wettable surfaces of component 4.

The method of the invention proposes that the substrate and heating element of the oven only be coupled when said heating element has reached sufficient temperature and temperature uniformity.

Means of cooling the heating element may be provided, of blow type or heat-carrying fluid circulation type. But such means, if they are provided, are reduced in relation to those used by devices of the prior art. In certain cases, they even be omitted, in particular when, as described below, the substrate-component alignment is not carried out on heating element 2. Regarding the parts of the apparatus that are sensitive to thermal dilatation (optical devices for example used for alignment) their temperature regulation system is no longer necessary since the substrate is only placed in contact with the heating element after the temperature rise of the latter. All alignment and/or optical control stages therefore take place before the substrate and component come into thermal contact with an element of high temperature.

Figure 4:
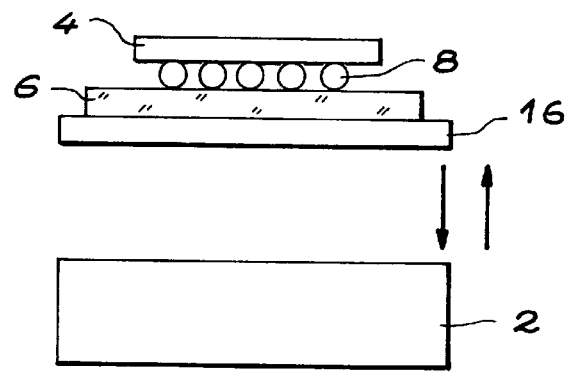

According to a variant illustrated in FIG. 4, substrate 6 and component 4 are previously deposited on a support 16; for example a heating-plate on which alignment is made. It is this heating-plate which is moved either over a vertical axis as illustrated in FIG. 4, for example using a vacuum bell-jar, or in the plane of heating element 2, as described above with reference to FIG. 3. Heating-plate 16 is therefore transferred instead of substrate 6. The thickness of heating-plate 16 determines its calorific capacity and allows control of the temperature rise of substrate 6 and component 4 when heating-plate 16 is brought into contact with heating element 2 that has been previously heated. Also, the use of a mobile support or a mobile heating-plate 16 makes its possible to convey and/or move substrates 6 of different sizes.

A further embodiment shall be described with reference to FIGS. 5A to 5E. In these figures, reference 2 again designates a heating element or heating-plate of an oven. This heating element or heating-plate rests on means 18, such as a mobile trolley, able to move in relation to a fixed frame 20. Therefore, heating element 2 may be moved between a first so-called alignment station 22 and a second so-called uncoupling station 24. At the level of station 24, means 28 are provided, such as for example a controlled atmosphere bell-jar, which allow movement over a vertical axis, either up or down movement, of a substrate and component.

Substrate 4 is previously placed on heating element 2 which is brought into alignment area 22. Here, a component 6 is aligned in relation to substrate 4 provided with beads using means already known to men of the art. Component 6 is then deposited on substrate 4.

Heating element 2 is then moved towards uncoupling station 24 (FIG. 5B) where the controlled atmosphere bell-jar 28 lifts off the substrate-component unit before the temperature of heating element 2 is raised. Then (FIG. 5C) after temperature rise and stabilisation, the substrate-component unit is lowered into thermal contact with heating element 2 to melt the microbeads. The controlled atmosphere inside device 28 is neither interrupted nor changed.

Figure 5A:
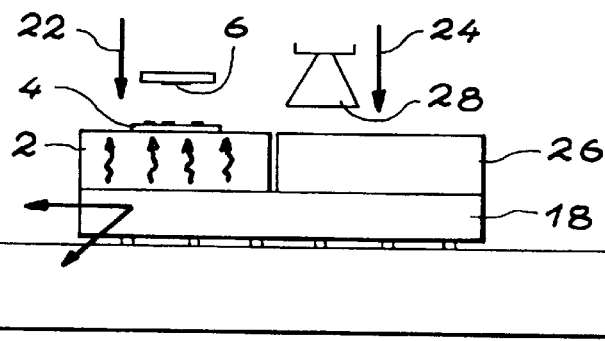
Figure 5B:
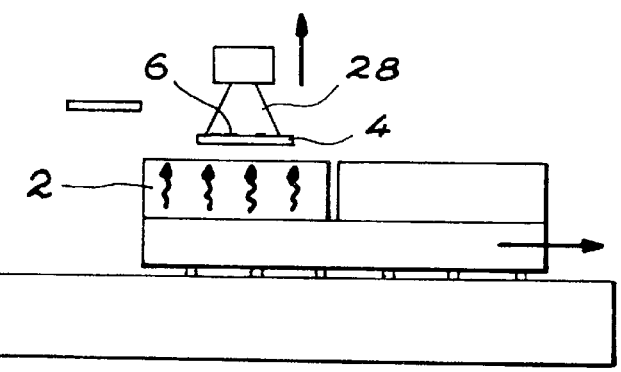
Figure 5C:
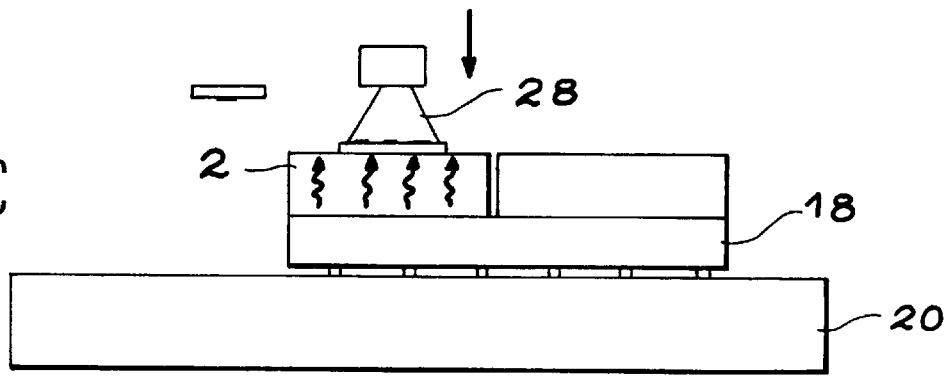
Figure 5D:
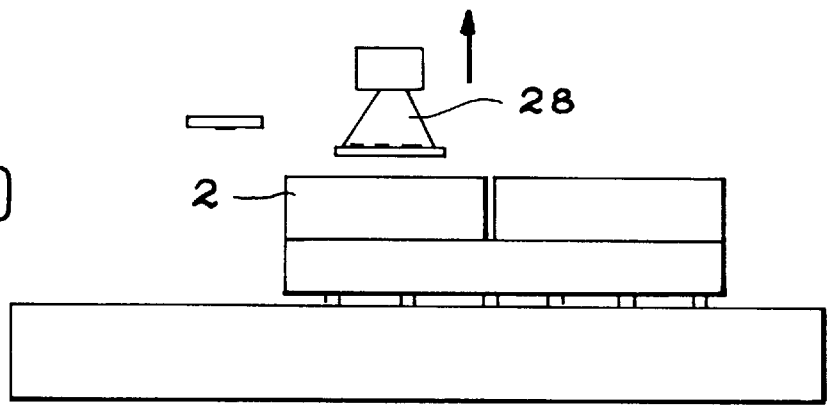
Figure 5E:
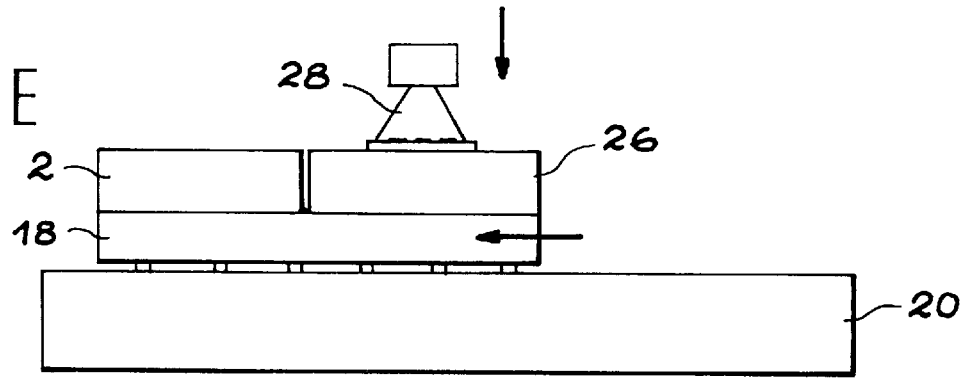

After melting and soldering the beads, the component-substrate unit is lifted back to top position by device 28 (FIG. 5D). The componenet-substrate unit may then be kept in this position until the hybridization metal has cooled or it may be transferred to a cooling area. At the same time heating element 2 may be returned by mobile trolley 18 to a loading area to collect another substrate which will be taken to the positioning and alignment area 22 for depositing of another component 6. According to a variant, a cooling plate 26 is placed next to heating element 2 on mobile trolley 18 and, after uncoupling substrate 4 and heating element 2 (FIG. 5D), the heating element/cooling plate unit is moved by trolley 18 so as to bring cooling plate 26 opposite station 24. Here, substrate 4 may be brought into contact with cooling plate 26 (FIG. 5E).

All the above-described stages with reference to FIGS. 5A to 5E may also be carried out with a substrate 4 placed on a mobile heating-plate 16 as illustrated in FIG. 4. It is therefore the mobile heating-plate which is transported in order to move the substrate and component.

The use of a mobile trolley 18 to move oven 2 and, possibly also cooling plate 26, means that the substrate and component need only be moved over a limited range: these movements consist of a move of a few millimetres or a few micrometres following a vertical axis and all side movements are made by the mobile trolley.

A further embodiment shall be described with reference to FIGS. 6A to 6D. In these figures heating element 2 is mounted on mobile trolley 18 in relation to a fixed substrate 20. Next to heating element 2 a loading and alignment support 30 is also positioned on the mobile trolley.

Figure 6A:
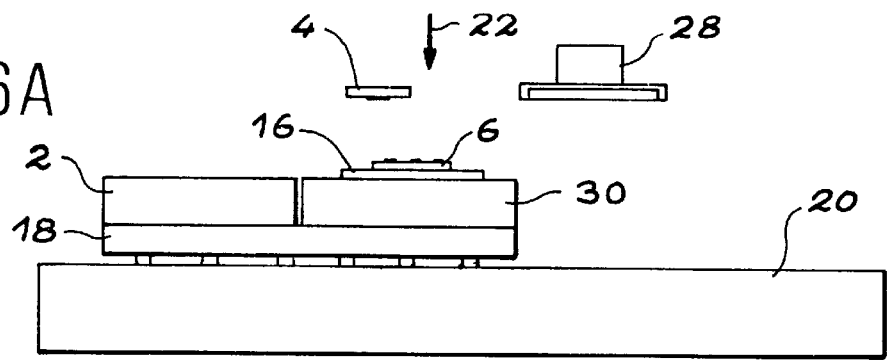
Figure 6B:
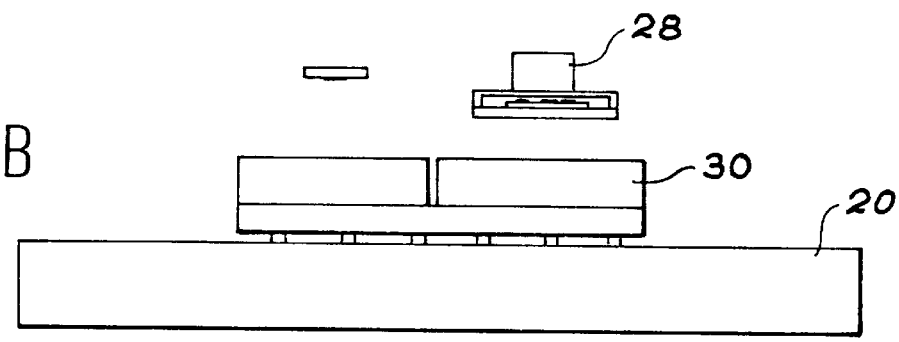
Figure 6C:
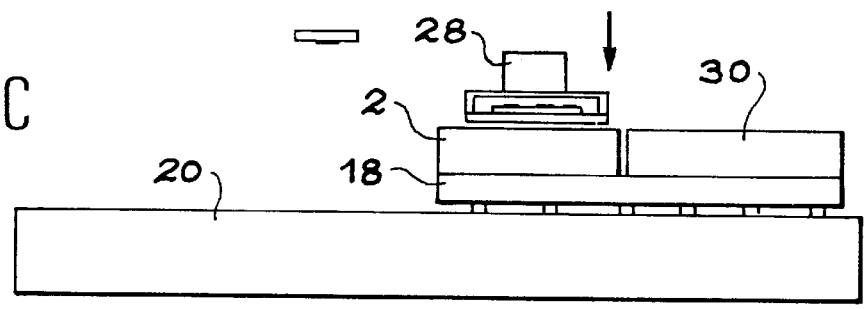
Figure 6D:
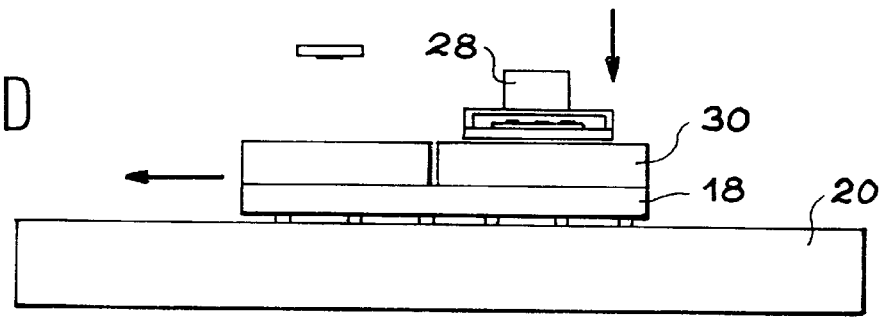

A substrate 6 (or a mobile heating-plate 16) are previously placed on support 30. The trolley is then moved in such manner as to bring said support into positioning area 22, where a component 4 is positioned in relation to substrate 6 (FIG. 6A). The trolley is then moved so as to to direct the unit made up of component 4, substrate 6 and possibly intermediate heating-plate 16 opposite the vacuum bell-jar 28. The latter is lowered, removes the component/substrate/heating-plate unit and lifts the latter to top position (FIG. 6B). Simultaneously, the temperature of heating element 2 is raised and, after temperature uniformity is reached, heating element 2 is brought under bell-jar 28 so that the latter may deposit thereupon the component/substrate/intermediate heating-plate unit (FIG. 6C). This unit then undergoes the fusion cycle. After said cycle, the bell-jar lifts back the component, substrate and intermediate heating-plate to top position and heating element 2 is removed by mobile trolley 18. Bell-jar 28 may be brought back to lower position onto support 30 to deposit the component/substrate/intermediate heating-plate unit. Support 28 may be a support or a cooling plate.

In this embodiment also the movements of the substrate and component are limited to vertical axis movements over a range of a few millimetres or a few micrometres, all lateral movements being made by mobile trolley 18.

In all the above-described embodiments, bell-jar 28 may be connected to a flexible or adjustable articulation able to offset parallelism defects between the lower surface of the bell-jar and substrate 6 or intermediate heating-plate 16 with which this lower surface is brought into contact.

All the operations for the various embodiments described above may be controlled by a microcomputer which collects data on temperature, positioning and alignment and which determines movements of the means of transfer such as mobile trolley 18, the raising or lowering of bell-jar 28, and the establishment of a controlled atmosphere inside the bell-jar. As will be understood by men of the art, the different stages may be programmed on a conventional microcomputer, the appropriate programme instructions being memorised on magnetic disks or conventional RAM or ROM storage units.

Whichever embodiment is chosen, the method of the invention makes it possible to reduce contact times between the substrate and the heating element, and it allows very good uniformity to be obtained over large surface areas even for substrates with a diameter of more than 200 mm.

Also, the production costs for the device used to carry out this method are considerably reduced since it is possible to reduce power supplies, oven cooling systems, to omit temperature adjustment systems for those parts sensitive to thermal dilation (such as optical parts or alignment devices), and it is possible to modify the oven temperature rise device to adapt less costly systems that are more uniform and simpler but have greater inertia. The possibility of carrying out alignment with the substrate positioned on the cooling table provides for a simple alignment table that is easy to adjust, and if necessary allows the oven to be permanently maintained at constant temperature which leads to increased machine efficiency.

We claim:

1. Method of hybridization of components by solder beads, on a substrate, using an oven, comprising successively:

positioning said substrate on a heating element of the oven, said heating element being maintained at a lower temperature than the melting point of said solder beads, aligning the component to be hybridized on the substrate, uncoupling the unit made up of the component to hybridize and the substrate and the heating element before the temperature of the latter is raised, raising the temperature of the heating element of the oven, without any contact either with the substrate or with the component to be hybridized, bringing the substrate into thermal contact with the heating element for a time Δt, uncoupling the substrate and the heating element at the end of time Δt.

2. Method in accordance with claim 1, the substrate being brought into thermal contact by lowering said substrate onto the heating element.

3. Method in accordance with claim 2, the lowering being made by means of a bell-jar in which a controlled atmosphere has been established.

4. Method in accordance with claim 1, the substrate and the component to be hybridized resting on a mobile heating-plate, the contact made between said mobile heating-plate with the heating element providing thermal contact between the substrate and the heating element.

5. Method in accordance with claim 1, the preliminary stage of uncoupling the unit made up of the component, the substrate and possibly the mobile heating-plate being made by lifting the substrate, the component and possibly the mobile heating element off the heating element.

6. Method in accordance with claim 5, the lifting being made by means of a bell-jar inside which a controlled atmosphere has been established.

7. Method in accordance with claim 1, the preliminary stage of aligning the component to be hybridized on the substrate taking place at a first so-called aligning station, the preliminary stage of uncoupling taking place at a second so-called uncoupling station, and the heating element being moved from the first station to the second station between the two preliminary stages of alignment and uncoupling.

8. Method in accordance with claim 1 comprising, after uncoupling the substrate and the heating element, a substrate cooling stage.

9. Method in accordance with claim 8, cooling taking place by contact of the substrate with a cooling surface.

10. Method in accordance with claim 9, wherein the cooling surface is a support on which the substrate is positioned.

11. Method of hybridization of components by solder beads, on a substrate, using an oven, successively comprising:

positioning said substrate on a mobile heating-plate resting on a heating element of the oven, said heating element being maintained at a lower temperature than the melting point of said solder beads, aligning the component to be hybridized on the substrate, uncoupling the unit made up of the component to hybridize, the substrate and the mobile heating-plate and the heating element before the temperature of the latter is raised, raising the temperature of the heating element of the oven, without any contact either with the substrate or the component to be hybridized, bringing the substrate into thermal contact with the heating element for a time Δt, uncoupling the substrate and the heating element at the end of time Δt.

12. Method in accordance with claim 11, the substrate being brought into thermal contact by lowering said substrate onto the heating element.

13. Method in accordance with claim 11, the substrate and the component to be hybridized resting on a mobile heating-plate, the contact between said mobile heating-plate with the heating element providing thermal contact between the substrate and the heating element.

14. Method in accordance with claim 11, the preliminary stage of uncoupling the unit made up of the component, the substrate and possibly the mobile heating-plate being made by lifting the substrate, the component and possibly the mobile heating element off the heating element.

15. Method in accordance with claim 11, the preliminary stage of aligning the component to be hybridized on the substrate taking place at a first so-called aligning station, the preliminary stage of uncoupling taking place at a second so-called uncoupling station, and the heating element being moved from the first station to the second station between the two preliminary stages of alignment and uncoupling.

16. Method in accordance with claim 11, after uncoupling the substrate and the heating element, a substrate cooling stage.

17. Method in accordance with claim 16, cooling taking place by contact of the mobile heating-plate with a cooling surface.

18. Method in accordance with claim 17, cooling taking place by contact with a cooling surface wherein the cooling surface is a support on which the substrate is positioned.

19. Method in accordance with claim 11, the substrate being brought into thermal contact by lowering said substrate onto the heating element.

20. Method in accordance with claim 11, the substrate and the component to be hybridized resting on a mobile heating-plate with the heating element providing thermal contact between the substrate and the heating element.

21. Method in accordance with claim 11, the preliminary stage of uncoupling the unit made up of the component, the substrate and the mobile heating-plate being made by lifting the substrate, the component and the mobile heating element off the heating element.

22. Method in accordance with claim 11, the preliminary stage of aligning the component to be hybridized on the substrate taking place at a first so-called aligning station, the preliminary stage of uncoupling taking place at a second so-called uncoupling station, and the heating element being moved form the first station to the second station between the two preliminary stages of alignment and uncoupling.

23. Method of hybridization of components by solder beads, on a substrate, using an oven comprising a heating element, said method comprising the following stages:

positioning said substrate on a support that is not in contact with the heating element, aligning the component to be hybridized on the substrate, raising the temperature of the heating element of the oven, without any contact either with the substrate or with the component to be hybridized until a temperature is reached allowing fusion of said solder beads, bringing the substrate into thermal contact with the heating element for a time Δt, uncoupling the substrate and the heating element at the end of time Δt, lifting of the substrate and component to be hybridized, the lifting taking place after transferring the unit made up of the substrate and the component to be hybridized towards a lifting and lowering station, the substrate being brought into thermal contact with the heating element by moving the heating element towards the lifting and lowering station, and lowering the unit made up of the component and the substrate after the temperature of the heating element has been raised.

24. Method of hybridization of components by solder beads, on a substrate, using an oven comprising a heating element, said method comprising the following stages:

positioning said substrate on a support that is not in contact with the heating element, aligning the component to be hybridized on the substrate, raising the temperature of the heating element of the oven, without any contact either with the substrate or with the component to be hybridized until a temperature is reached allowing fusion of said solder beads, bringing the substrate into thermal contact with the heating element for a time $\Delta t$, the substrate and the component to be hybridized resting on a mobile heating-plate, the contact made between said mobile heating-plate with the heating element providing thermal contact between the substrate and the heating element, uncoupling the substrate and the heating element at the end of time $\Delta t$, lifting of the substrate, the component to be hybridized and the mobile heating-plate, the lifting of the substrate, the component and the heating-plate taking place after transferring the unit made up of the substrate, the component to be hybridized and the mobile heating-plate towards a lifting and lowering station.

25. Method in accordance with claim 24, the substrate being brought into thermal contact with the heating element by moving the heating element towards the lifting and lowering station, and lowering the unit made up of the component, the substrate and the mobile heating-plate after the temperature of the heating element has been raised.

26. Method of hybridization of components by solder beads, on a substrate, using an oven, comprising:

raising the temperature of a heating element of the oven with non contact either with the substrate or with the component to be hybridized until a temperature is reached allowing fusion of said solder beads, bringing the substrate into thermal contact with the heating element for a time $\Delta t$, uncoupling the substrate and heating element at the end of time $\Delta t$, the substrate being brought into thermal contact by lowering said substrate onto the heating element, the lowering being made by means of a bell-jar inside which a controlled atmosphere has been established.

27. Method of hybridization of components by solder beads, on a substrate, using an oven comprising a heating element, said method comprising the following stages:

positioning said substrate on a support that is not in contact with the heating element, aligning the component to be hybridized on the substrate, raising the temperature of the heating element of the oven, without any contact either with the substrate or with the component to be hybridized until a temperature is reached allowing fusion of said solder beads, bringing the substrate into thermal contact with the heating element for a time $\Delta t$, and uncoupling the substrate and the heating element at the end of time $\Delta t$, the support on which the substrate is positioned consisting of a cooling surface.

28. Device for the hybridization of components by solder beads, on a substrate, comprising:

an oven comprising a heating element, means for bringing the substrate into thermal contact with the heating element, after the heating element has reached a temperature allowing fusion of said solder beads;

means of uncoupling the substrate and the heating element, after heating the substrate, the means of bringing the substrate into thermal contact with the heating element and of uncoupling the substrate after heating being means allowing a vertical movement, and the means of bringing the substrate into contact with the heating element and of uncoupling the substrate after heating, comprising a bell-jar and means of establishing a controlled atmosphere under said bell-jar.

29. Device in accordance with claim 28, comprising in addition means of moving the heating element.

30. Device in accordance with claim 28, comprising in addition a support on which a substrate may be positioned without contact with the heating element.

31. Device in accordance with claim 28 comprising in addition substrate cooling means.

32. Device in accordance with claim 28 comprising a cooling plate.

33. Device in accordance with claim 28, comprising in addition means of moving the heating element.

34. Device in accordance with claim 33, the means of moving said heating element comprising a mobile trolley on which the heating element id mounted.

35. Device in accordance with claim 28, comprising in addition a support on which a substrate may be positioned without contact with the heating element.

36. Device in accordance with claim 28, comprising in addition substrate cooling means.

37. Device in accordance with claim 28, comprising a cooling plate.

38. Device for the hybridization of components by solder beads, on a substrate, comprising:

an oven comprising a heating element, means for bringing the substrate into thermal contact with the heating element, after the heating element has reached a temperature allowing fusion of said solder beads;

means of uncoupling the substrate and the heating element, after heating the substrate; and means of moving the heating element, the means of moving said heating element comprising a mobile trolley on which the heating element is mounted.

39. Device for the hybridization of components by solder beads, on a substrate, comprising:

an oven comprising a heating element, means for bringing the substrate into thermal contact with the heating element, after the heating element has reached a temperature allowing fusion of said solder beads;

means of uncoupling the substrate and the heating element, after heating the substrate, the means of bringing the substrate into thermal contact with the heating element and of uncoupling the substrate after heating being means allowing a vertical movement, and the means of bringing the substrate into thermal contact with the heating element or of uncoupling the substrate after heating, comprising a bell-jar and means of establishing a controlled atmosphere under said bell-jar.

40. Device in accordance with claim 39, comprising in addition a support on which a substrate may be positioned without contact with the heating element.

41. Device in accordance with claim 39, comprising in addition substrate cooling means.

42. Device in accordance with claim 39, comprising a cooling plate.

43. Device in accordance with claim 39, comprising in addition means of moving the heating element.

44. Device in accordance with claim 43, the means of moving said heating element comprising a mobile trolley on which the heating element is mounted.

45. Device in accordance with claim 39, comprising in addition means of moving the heating element.

46. Device in accordance with claim 39, comprising in addition a support on which a substrate may be positioned without contact with the heating element.

47. Device in accordance with claim 39, comprising a cooling plate.

48. Device in accordance with claim 39, comprising in addition substrate cooling means.

49. Device for the hybridization of components by solder beads, on a substrate, comprising:
   an oven comprising a heating element,
   means for bringing the substrate into thermal contact with the heating element, after the heating element has reached a temperature allowing fusion of said solder beads;
   means of uncoupling the substrate and the heating element, after heating the substrate,
   the means of bringing the substrate into thermal contact with the heating element or of uncoupling the substrate after heating being means allowing a vertical movement and, comprising a bell-jar and means of establishing a controlled atmosphere under said bell-jar.

50. Device in accordance with claim 49, comprising in addition means of moving the heating element.

51. Device in accordance with claim 50, the means of moving said heating element comprising a mobile trolley on which the heating element id mounted.

52. Device in accordance with claim 49, comprising in addition a support on which a substrate may be positioned without contact with the heating element.

53. Device in accordance with claim 49, comprising in addition substrate cooling means.

54. Device in accordance with claim 49, comprising a cooling plate.

55. Device in accordance with claim 49, comprising in addition means of moving the heating element.

56. Device in accordance with claim 49, comprising in addition a support on which a substrate may be positioned without contact with the heating element.

57. Device in accordance with claim 49 comprising in addition substrate cooling means.

58. Device in accordance with claim 49 comprising a cooling plate.

* * * * *